United States Patent
Min et al.

(10) Patent No.: US 6,630,834 B2
(45) Date of Patent: Oct. 7, 2003

(54) APPARATUS AND METHOD FOR MEASURING CHANGE IN CAPACITANCE

(75) Inventors: Dong-ki Min, Kyungki-do (KR); Jong Up Jeon, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/682,572

(22) Filed: Sep. 21, 2001

(65) Prior Publication Data

US 2003/0006783 A1 Jan. 9, 2003

(30) Foreign Application Priority Data

Jul. 2, 2001 (KR) .......................... 2001-39329

(51) Int. Cl.[7] .......................... G01R 27/02; G01R 27/26
(52) U.S. Cl. .......................... 324/676; 324/605; 324/607; 324/658
(58) Field of Search ................................ 324/676, 658, 324/605, 607

(56) References Cited

U.S. PATENT DOCUMENTS

| | | | | |
|---|---|---|---|---|
| 4,345,474 A | * | 8/1982 | Deval ...................... | 73/514.18 |
| 5,528,520 A | * | 6/1996 | Kemp ...................... | 702/104 |
| 5,612,494 A | * | 3/1997 | Shibano ................... | 73/514.32 |
| 5,672,949 A | * | 9/1997 | Ward ....................... | 318/609 |
| 6,035,694 A | * | 3/2000 | Dupuie et al. ............ | 73/1.38 |

OTHER PUBLICATIONS

A. H. Falkner, "Use of Capacitance in the Measurement of Angular & Linear Displacement", IEEE Transactions on Instrumentation and Measurement, vol. 43, Issue 6, Dec. 1994, pp 939–942.

Scott A. Valoff et al., "Self–Balancing Interface Circuit for Presettable Micromachined MEMS Accelerometers", IEEE Transducers 99, pp. 814–817, Jun. 1999.

* cited by examiner

Primary Examiner—Jay Patidar
Assistant Examiner—John Teresinski
(74) Attorney, Agent, or Firm—Burns, Doane, Swecker & Mathis, L.L.P.

(57) ABSTRACT

The apparatus includes a first gain adjuster, a second gain adjuster, an amplifier, a demodulator, a controller, and a change measuring unit. The first gain adjuster adjusts the gain of an input signal and outputs the gain-adjusted input signal as a first modulating signal, while the second gain adjuster adjusts the gain of an inverted input signal and outputs the gain-adjusted inverted input signal as a second modulating signal. The amplifier amplifies a modulated signal output from a junction between the first and second capacitors and outputs the amplified results. The demodulator demodulates the amplified results received from the amplifier in response to a control signal and outputs the demodulated result. The controller generates the control signal per unit period of the input signal and outputs the generated control signal to the demodulator. The change measuring unit measures the change in capacitance from the demodulated results received from the demodulator. An offset produced by parasitic capacitance is compensated without affecting the change in capacitance to be measured.

30 Claims, 10 Drawing Sheets

APPARATUS AND METHOD FOR MEASURING CHANGE IN CAPACITANCE

BACKGROUND OF THE INVENTION

1. Field of the Invention

The present invention relates to capacitance measurement, and more particularly, to an apparatus and method for measuring changes in capacitance.

2. Description of the Related Art

The acceleration or position of an electrostatic accelerator or an actuator can be measured be detecting changes in capacitance of the electrostatic accelerator or the actuator. However, an offset is produced by parasitic capacitance induced in the electrostatic accelerator or the actuator, and changes in capacitance cannot be precisely detected because of this offset.

A number of techniques have been developed to compensate for an offset produced by the parasitic capacitance. One technique is disclosed in an article by Anthony Hugh Falkner, "The Use of Capacitance in the Measurement of Angular and Linear Displacement", IEEE Transactions on Instrumentation and Measurement, Vol. 43, No. 6, pp. 939–942, December, 1994. The conventional technique disclosed in the article is to detect changes in capacitance using an asymmetric square-wave modulating signal. However, this conventional technique has a problem in that the gain of a detector will vary due to parasitic capacitance induced around capacitors C1, C2, and C3 shown in FIG. 7 of the article.

Another technique is disclosed in an article presented by Scott A. Valoff and William J. Kaiser, "Self-Balancing Interface Circuit for Presettable Micromachined MEMS Accelerometers", IEEE Transducers 99, pp. 814–817, June 1999. The conventional technique disclosed in the article is to compensate inconsistency in capacitance in presettable MEMS accelerometers using an asymmetric square-wave modulating signal. However, the conventional technique has a drawback in that the gain of a detector varies though distortion in a detected signal. Consequently, the above two techniques have a problem in that changes in capacitance cannot be precisely detected.

SUMMARY OF THE INVENTION

To solve the above problems, it is a first object of the present invention to provide an apparatus for measuring a change in capacitance that can compensate for an offset produced by parasitic capacitance while not affecting the detected change in capacitance.

It is a second object of the present invention to provide a method for measuring a change in capacitance performed by the apparatus for measuring a change in capacitance.

To achieve the first object, the present invention provides an apparatus for measuring a change in capacitance in an object modeled as first and second capacitors connected in series between first and second terminals, wherein the capacitance of one of the first and second capacitors increases by a certain amount and that of the other decreases by the same amount when a perturbation is applied. The apparatus includes: a first gain adjuster that adjusts the gain of an input signal and outputs the gain-adjusted input signal to the first terminal as a first modulating signal; a second gain adjuster that adjusts the gain of an inverted input signal and outputs the gain-adjusted inverted input signal to the second terminal as a second modulating signal; an amplifier that amplifies a modulated signal output from a junction between the first and second capacitors and outputs the amplified result; a demodulator that demodulates the amplified result received from the amplifier in response to a control signal and outputs the demodulated result; a controller that generates the control signal per unit period of the input signal and outputs the generated control signal to the demodulator; and a change measuring unit that measures the change in capacitance from the demodulated result received from the demodulator.

To achieve the second object, the present invention provides a method for measuring changes in capacitance including the steps of: (a) adjusting the gain of an input signal to obtain a first modulating signal and adjusting the gain of an inverted input signal to obtain a second modulating signal; (b) amplifying a modulated signal measured at a junction between the first and second capacitors; (c) demodulating the amplified result in response to a control signal; and (d) measuring the change in capacitance using the demodulated result.

BRIEF DESCRIPTION OF THE DRAWINGS

The above objects and advantages of the present invention will become more apparent by describing in detail preferred embodiments thereof with reference to the attached drawings in which.

DETAILED DESCRIPTION

Hereinafter, the configuration and operation of an apparatus for measuring changes in capacitance according to the present invention and a method for measuring changes in capacitance according to the present invention performed by the apparatus will be described with reference to the attached drawings.

Figure 1:
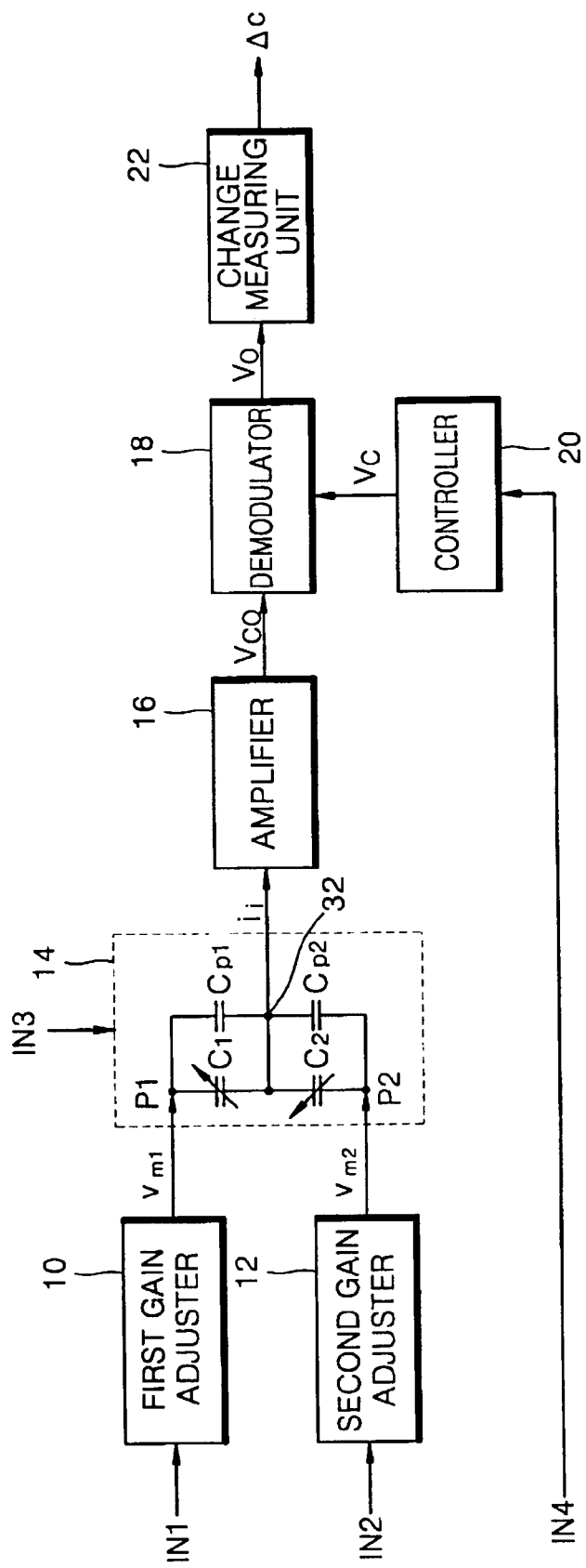
FIG. 1 is a block diagram of an apparatus for measuring changes in capacitance according to the present invention.

Referring to FIG. 1, an apparatus for measuring changes in capacitance according to the present invention includes first and second gain adjusters 10 and 12, an amplifier 16, a demodulator 18, a controller 20, and a change measuring unit 22.

Figure 2:
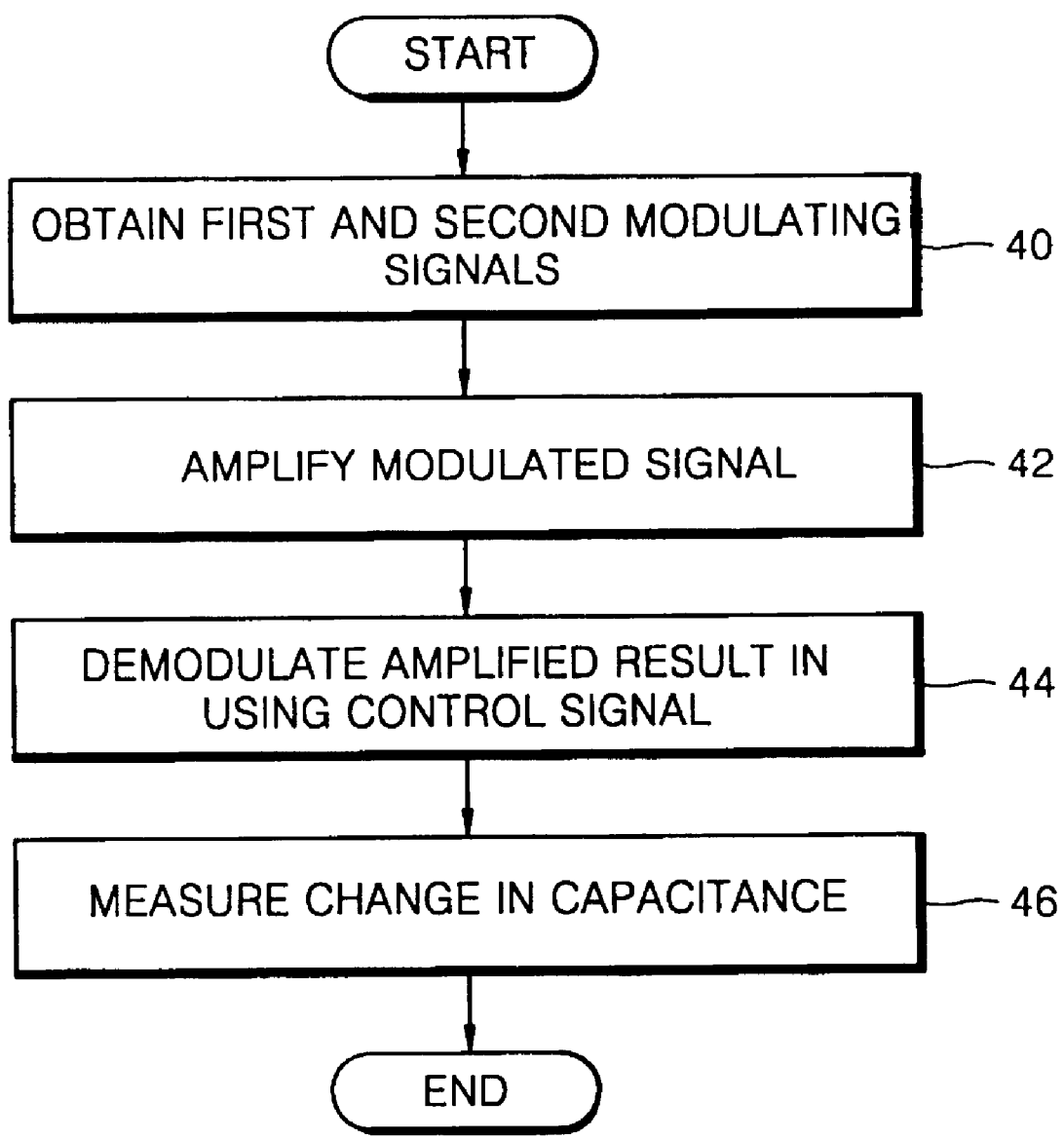
FIG. 2 is a flowchart for explaining a method for measuring changes in capacitance according to the present invention performed by the apparatus of FIG. 1.

Referring to FIG. 2, a method for measuring changes in capacitance according to the present invention includes amplifying a signal modulated by first and second modulating signals (steps 40 and 42) and measuring changes in capacitance by using the result of demodulating the amplified result (steps 44 and 46).

First, as shown in FIG. 1, an object 14 in which changes in capacitance are to be measured must be modeled as first and second capacitors $C_1$ and $C_2$ coupled in series between first and second terminals P1 and P2. In this case, if the object 14 undergoes a perturbation applied through an input terminal IN3, the capacitance of one of the first and second capacitors $C_1$ and $C_2$ increases by a certain amount and that of the other decreases by the same amount. Here, the perturbation applied through the input terminal IN3 may be mechanical or electrostatic force.

For example, it is assumed that the first and second capacitors $C_1$ and $C_2$ have a nominal capacitance value $C_0$ when no perturbation is applied to the object 14. If a perturbation is applied to the object 14 through the input terminal IN3, the capacitances of the first and second capacitors $C_1$ and $C_2$ are $C_0+\Delta c$ and $C_0-\Delta c$, respectively. That is, if the capacitance of the first capacitor $C_1$ is changed by $\Delta c$, the capacitance of the second capacitor $C_2$ is differentially changed by $-\Delta c$.

According to the present invention, an electrostatic accelerometer, an actuator, or a gyroscope can be modeled as the object 14 having the serially connected first and second capacitors $C_1$ and $C_2$ of differently varying capacitances. In this case, the acceleration of the electrostatic accelerometer, the position of the actuator, or the angular velocity of the gyroscope may be obtained from the change $\Delta c$ in capacitances of the first and second capacitors $C_1$ and $C_2$.

An apparatus and method for measuring a change in capacitance according to the present invention measure the change $\Delta c$ in capacitance of the object 14 in the following way. In step 40, the gain of an input signal is adjusted to obtain a first modulating signal, and the gain of an inverted input signal is adjusted to obtain a second modulating signal. Here, the input signal may be a periodic square wave, a periodic sine wave, or direct current voltage. To perform step 40, the first gain adjuster 10 adjusts the gain of the input signal input through an input terminal IN1 and outputs an input signal having the adjusted gain to the first terminal P1 of the object 14 as the first modulating signal $v_{m1}$. Also, the second gain adjuster 12 adjusts the gain of the inverted input signal input through an input terminal IN2 and outputs the inverted input signal having the adjusted gain to the second terminal P2 of the object 14 as the second modulating signal $v_{m2}$. The gains adjusted by the first and second gain adjusters 10 and 12 will now be described.

It is assumed that the first and second modulating signals $v_{m1}$ and $v_{m2}$ provided to the first and second terminals P1 and P2 of the object 14 are square waves with DC offset and are expressed by Equation (1):

$$v_{m1} = \alpha\left(\frac{V_m}{2} + v_m\right), \quad v_{m2} = \beta\left(\frac{V_m}{2} - v_m\right) \quad (1)$$

where $V_m/2+v_m$ denotes the input signal input to the first gain adjuster 10 through the input terminal IN1, $v_m$ is a square wave whose amplitude is $V_m/2$ and $V_m/2-v_m$ denotes the inverted input signal input to the second gain adjuster 12 through the input terminal IN2. Assuming that parasitic capacitances induced around the first and second capacitors $C_1$ and $C_2$ of the object 14 are $C_{p1}$ and $C_{p2}$, respectively, a modulated signal output from the object 14 to the amplifier 16, for example, current $i_i$, is expressed by Equation (2):

$$\begin{aligned}
i_i &= \frac{dQ}{dt} \\
&= \frac{d}{dt}\{C_1 v_{m1} + C_2 v_{m2}\} \\
&= \frac{d}{dt}\{(C_0 + \Delta c + C_{p1})v_{m1} + (C_0 - \Delta c + C_{p2})v_{m2}\}
\end{aligned} \quad (2)$$

Here, if Equation (1) is substituted into Equation (2), the modulated signal $i_i$ is expressed by Equation (3):

$$i_i = [\alpha(C_0 + C_{P1}) - \beta(C_0 + C_{P2})]\frac{dv_m}{dt} + (\alpha + \beta)\Delta c \frac{dv_m}{dt} \quad (3)$$

Here, a term which does not include the component of $\Delta c$, that is, $$[\alpha(C_0 + C_{p1}) - \beta(C_0 + C_{p2})]\frac{dv_m}{dt},$$

corresponds to a total offset including an offset produced by the parasitic capacitance $C_{p1}$ and $C_{p2}$. Thus, to eliminate the offset from the current $i_i$ in the Equation (3), the following condition expressed by Equation (4) must be satisfied:

$$\alpha(C_0+C_{p1})=\beta(C_0+C_{p2}) \quad (4)$$

Furthermore, the following condition expressed by Equation (5) must be met in order to measure a change in capacitance as though the parasitic capacitance $C_{p1}$ and $C_{p2}$ has no impact on the change in capacitance:

$$\alpha+\beta=2 \quad (5)$$

$\alpha$ and $\beta$ are obtained from Equation (6) using Equations (4) and (5):

$$\alpha = \frac{2(C_0 + C_{p2})}{D}, \quad \beta = \frac{2(C_0 + C_{p1})}{D} \quad (6)$$

where $$D=2C_0+C_{p1}+C_{p2}.$$

The first gain adjuster 10 adjusts the gain of the input signal by α in Equation (6) to generate the first modulating signal $v_{m1}$ as expressed by Equation (7), and the second gain adjuster 12 adjusts the gain of the inverted input signal by β in Equation (6) to generate the second modulating signal $v_{m2}$ as expressed by Equation (8):

$$v_{m1} = \frac{2(C_0 + C_{p2})}{2C_0 + C_{p1} + C_{p2}}\left(\frac{V_m}{2} + v_m\right) \quad (7)$$

$$v_{m2} = \frac{2(C_0 + C_{p1})}{2C_0 + C_{p1} + C_{p2}}\left(\frac{V_m}{2} - v_m\right) \quad (8)$$

The configurations and operations of the first and second gain adjusters 10 and 12 according to preferred embodiments when the input signal and the inverted input signal respectively input to the first and second gain adjusters 10 and 12 of FIG. 1 is a square wave or a sine wave will now be described with reference to FIGS. 3–5.

Figure 3:
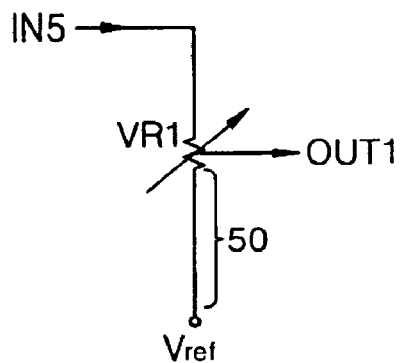
FIG. 3 is a circuit diagram of a first embodiment of the first or second gain adjuster of FIG. 1 according to the present invention.

FIG. 3 is a circuit diagram of a first embodiment of the first or second gain adjuster 10 or 12 according to the present invention. Referring to FIG. 3, the first or second gain adjuster 10 or 12 is comprised of a first variable resistor VR1 whose one end is connected to an input signal input through an input terminal IN5 and whose other end is connected to a reference potential Vref. Thus, the first variable resistor VR1 shown in FIG. 3 can serve as the first gain adjuster 10. In this case, if the resistance of the first variable resistor VR1 is varied so that a voltage drop 50 across a part of the first variable resistor VR1 is equal to the first modulating signal $v_{m1}$, the voltage drop 50 is output to the first terminal P1 of the object 14 through an output terminal OUT1 as the first modulating signal $v_{m1}$ expressed by Equation (7).

Alternatively, if one end of the first variable resistor VR1 is connected to an inverted input signal input through the input terminal IN5 and the other end thereof is connected to the reference potential Vref, the first variable resistor VR1 shown in FIG. 3 may serve as the second gain adjuster 12. In this case, if the resistance of the first variable resistor VR1 is varied so that the voltage drop 50 across the part of the first variable resistor VR1 is equal to the second modulating signal $v_{m2}$, the voltage drop 50 is output to the second terminal P2 of the object 14 through the output terminal OUT1 as the second modulating signal $v_{m2}$ expressed by Equation (8).

Figure 4:
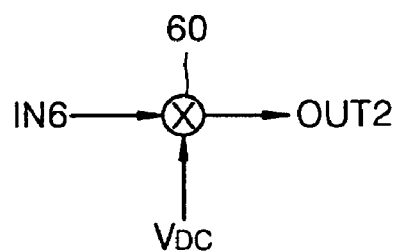
FIG. 4 is a circuit diagram of a second embodiment of the first or second gain adjuster of FIG. 1 according to the present invention.

FIG. 4 is a circuit diagram of a second embodiment of the first or second gain adjuster 10 or 12 of FIG. 1 according to the present invention. Referring to FIG. 4, the first or second gain adjuster 10 or 12 is comprised of a first multiplier 60. To perform the function of the first gain adjuster 10, the first multiplier 60 multiplies a DC voltage $V_{DC}$ by an input signal input through an input terminal IN6 and outputs the multiplication result to the first terminal P1 of the object 14 through an output terminal OUT2 as the first modulating signal $v_{m1}$. In this case, the level of the DC voltage $V_{DC}$ is determined so that the multiplication result output from the first multiplier 60 is equal to the first modulating signal $v_{m1}$ expressed by Equation (7).

Alternatively, to perform the function of the second gain adjuster 12, the first multiplier 60 may multiply an inverted input signal input through the input terminal IN6 by the DC voltage $V_{DC}$ and output the multiplication result to the second terminal P2 of the object 14 through the output terminal OUT2 as the second modulating signal $v_{m2}$. In this case, the level of the DC voltage $V_{DC}$ is determined so that the multiplication result output from the first multiplier 60 is equal to the second modulating signal $v_{m2}$ expressed by Equation (8).

Figure 5:
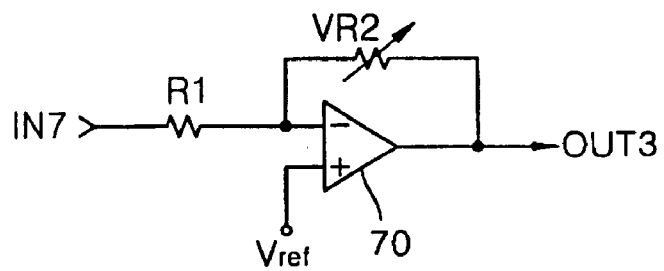
FIG. 5 is a circuit diagram of a third embodiment of the first or second gain adjuster of FIG. 1 according to the present invention.

FIG. 5 is a circuit diagram of a third embodiment of the first or second gain adjuster 10 or 12 of FIG. 1 according to the present invention. Referring to FIG. 5, the first or second gain adjuster 10 or 12 includes a first resistor R1, a second variable resistor VR2, and a first operational amplifier 70. To perform the function of the first gain adjuster 10, one end of the first resistor R1 is connected to an input signal input through an input terminal IN7, and the second variable resistor VR2 is connected between the other end of the first resistor R1 and the first modulating signal $v_{m1}$. Furthermore, a negative input terminal of the first operational amplifier 70 is connected to the other end of the first resistor R1, a positive input terminal thereof is connected to a reference potential Vref, and an output terminal thereof is connected to the first modulating signal $v_{m1}$. In this case, the first gain adjuster 10 of FIG. 5 amplifies the input signal input through the input terminal IN7 by α to generate the first modulating signal $v_{m1}$ expressed by Equation (7) and outputs the generated first modulating signal $v_{m1}$ to the first terminal P1 of the object 14 through an output terminal OUT3.

Alternatively, to perform the function of the second gain adjuster 12, one end of the first resistor R1 is connected to an inverted input signal input through the input terminal IN7, and the second variable resistor VR2 is connected between the other end of the first resistor R1 and the second modulating signal $v_{m2}$. Furthermore, the negative input terminal of the first operational amplifier 70 is connected to the other end of the first resistor R1, the positive input terminal thereof is connected to the reference potential Vref, and the output terminal thereof is connected to the second modulating signal $v_{m2}$. In this case, the second gain adjuster 12 of FIG. 5 amplifies the inverted input signal input through the input terminal IN7 by β to generate the second modulating signal $v_{m2}$ expressed by Equation (8) and outputs the generated second modulating signal $v_{m2}$ to the second terminal P2 of the object 14 through the output terminal OUT3.

The configuration and operation of the first or second gain adjuster 10 or 12 according to a preferred embodiment of the present invention when an input signal or an inverted input signal input to the first or second gain adjuster 10 or 12 is in the form of a DC voltage will now be described with reference to FIG. 6.

Figure 6:
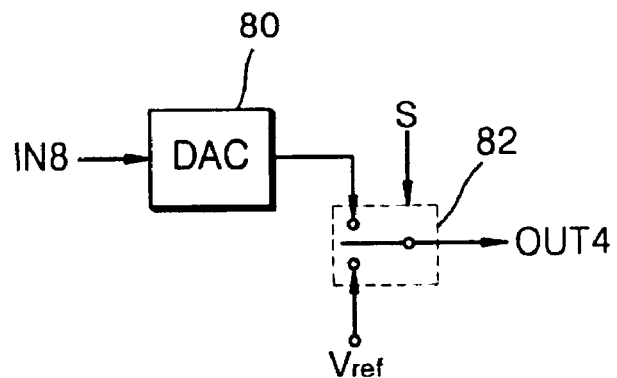
FIG. 6 is a circuit diagram of a fourth embodiment of the first or second gain adjuster of FIG. 1 according to the present invention.

FIG. 6 is a circuit diagram of a fourth embodiment of the first or second gain adjuster 10 or 12 according to the present invention. Referring to FIG. 6, the first or second gain adjuster 10 or 12 includes a digital-to-analog converter (DAC) 80 and a first switch 82. To perform the function of the first gain adjuster 10, the DAC 80 of FIG. 6 receives a digital signal having a predetermined amplitude $V_m$ input through an input terminal IN8 as an input signal to change the digital signal to a first analog signal and outputs the first analog signal to the first switch 82. In this case, the first switch 82 is periodically switched with a first predetermined period in response to a switching control signal S input from the outside to alternately determine the first analog signal received from the DAC 80 and a reference signal Vref as the first modulating signal $v_{m1}$ and output the first modulating signal $v_{m1}$ in the form of a square wave expressed by Equation (7) to the first terminal P1 of the object 14 through an output terminal OUT4.

Alternatively, to perform the function of the second gain adjuster 12, the DAC 80 of FIG. 6 receives the digital signal having the predetermined amplitude $V_m$ input through the input terminal IN8 as an inverted input signal to change the digital signal to a second analog signal, and outputs the second analog signal to the first switch 82. In this case, the first switch 82 is periodically switched with a second predetermined period in response to the switching control signal S input from the outside to alternately determine the second analog signal received from the DAC 80 and the reference signal Vref as the second modulating signal $v_{m2}$, and outputs the first modulating signal $v_{m2}$ in the form of a square wave expressed by Equation (8) to the second terminal P2 of the object 14 through the output terminal OUT4.

Here, the first and second periods are predetermined so that the first and second modulating signals $v_{m1}$ and $v_{m2}$ are complementarily generated by the first switch 82, and the switching control signal S is input to the first switch 82 from the outside according to the first and second predetermined periods.

While the first or second gain adjusters 10 or 12 shown in FIGS. 3–5 may be used irrespective to whether an input signal or an inverted input signal input through IN1 or IN2 is square waves or sine waves, the first or second gain adjuster 10 or 12 of FIG. 6 is used only when an input signal or an inverted input signal through an input terminal IN1 or IN2 is in the form of a DC voltage. Regardless of which one of the circuits shown in FIGS. 3–6 is implemented as the first or second gain adjuster 10 or 12, the forms of the first and second modulating signals $v_{m1\ and\ vm2}$ are the same as those expressed by Equations (7) and (8).

Turning to FIG. 2, after the step 40, the amplifier 16 amplifies a modulated signal output from a junction 32 of the first and second capacitors $C_1$ and $C_2$ of the object 14 in which a change in capacitance is to be measured and outputs the amplified result $V_{co}$ to the demodulator 18 in step 42. Here, the modulated signal may be in the form of current or voltage depending on how the amplifier 16 is implemented.

The configurations and operations of the amplifier 16 of FIG. 1 according to preferred embodiments of the present invention will now be described with reference to FIGS. 7 and 8.

Figure 7:
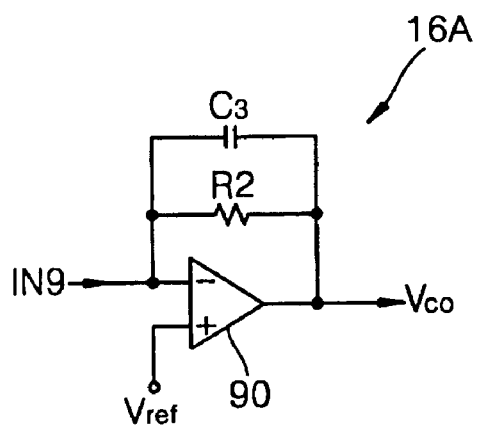
FIG. 7 is a circuit diagram of a first embodiment of the amplifier of FIG. 1 according to the present invention.

FIG. 7 is a circuit diagram of a preferred embodiment 16A of the amplifier 16 of FIG. 1 according to the present invention. Referring to FIG. 7, the amplifier 16A includes a third capacitor $C_3$, a second resistor R2, and a second operational amplifier 90. The second resistor R2 of the amplifier 16A of FIG. 7 is coupled between a modulated signal $i_i$ in the form of current input from the object 14 through an input terminal IN9 and the amplified result $V_{co}$, and the third capacitor $C_3$ is coupled to the second resistor R2 in parallel. Furthermore, a negative input terminal of the second operational amplifier 90 is coupled to the modulated signal $i_i$, a positive input terminal thereof is coupled to a reference potential Vref, and an output terminal thereof is coupled to the amplified result $V_{co}$. In this case, the amplifier 16A of FIG. 7 is implemented as a charge amplifier (CA) having very low input impedance to convert the modulated signal $i_i$ in the form of current into the amplified result $V_{co}$ in the form of voltage and output the amplified result $V_{co}$ to the demodulator 18.

Figure 8:
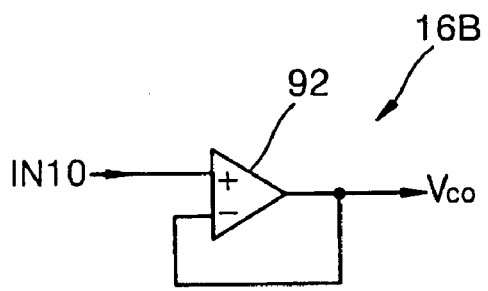
FIG. 8 is a circuit diagram of a second embodiment of the amplifier of FIG. 1 according to the present invention.

FIG. 8 is a circuit diagram of another preferred embodiment 16B of the amplifier 16 of FIG. 1 according to the present invention. Referring to FIG. 8, the amplifier 16B is comprised of only a third operational amplifier 92. The third operational amplifier 92 of the amplifier 16B of FIG. 8 inputs a voltage at the junction 32 of the object 14, which is a modulated signal in the form of voltage, to a positive input terminal thereof through an input terminal IN10, and outputs the input modulated signal as the amplified result $V_{co}$. The amplifier 16B of FIG. 8 is implemented as a voltage follower having very high input impedance to output the modulated signal in the form of voltage as the amplified result $V_{co}$.

After step 42, the demodulator 18 of FIG. 1 demodulates the amplified result $V_{co}$ received from the amplifier 16 in response to a control signal $V_c$ received from the controller 20 and outputs the demodulated result $V_o$ to the change measuring unit 22 in step 44.

The configurations and operations of the demodulator 18 of FIG. 1 according to preferred embodiments of the present invention will now be described with reference to FIGS. 9–12.

Figure 9:
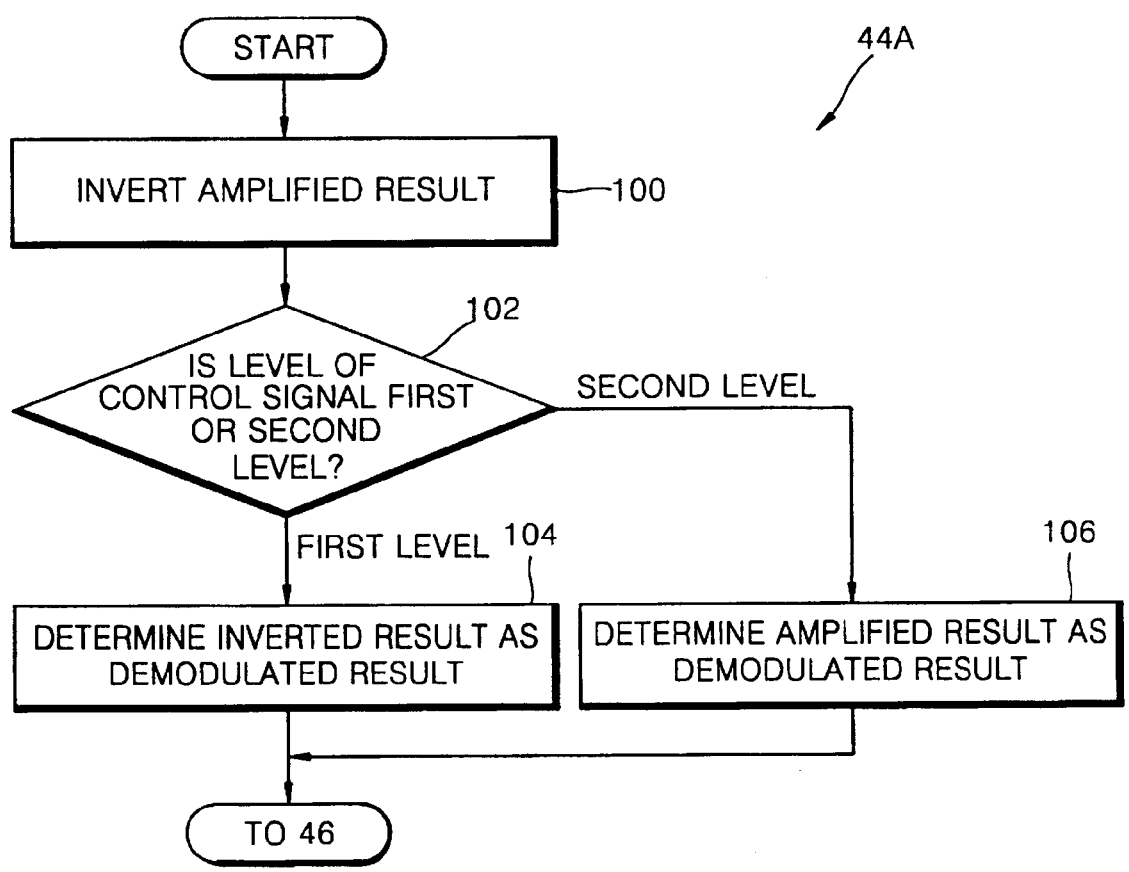
FIG. 9 is a flowchart for explaining step 44 of FIG. 2 according to an embodiment of the present invention.

FIG. 9 is a flowchart of a step 44A according to an embodiment of step 44 of FIG. 2 of the present invention. Referring to FIG. 9, the step 44A includes inverting the amplified result $V_{co}$ (step 100) and determining the inverted result $-V_{co}$ or the amplified result $V_{co}$ as the demodulated result $V_o$ depending on the level of the control signal $V_c$ (steps 102, 104, and 106).

Figure 10:
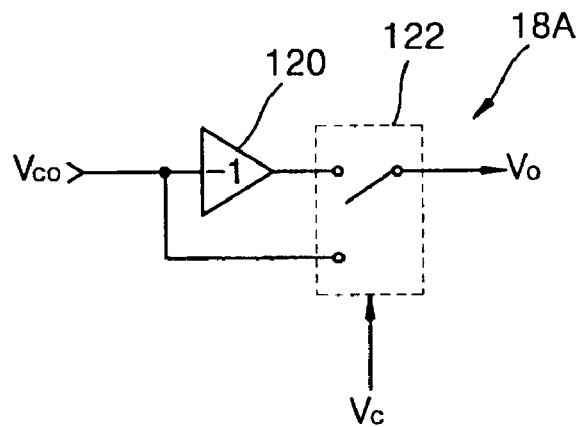
FIG. 10 is a circuit diagram of a first embodiment of the demodulator of FIG. 1 according to the present invention.

FIG. 10 is a circuit diagram of a first embodiment 18A of the demodulator 18 of FIG. 1 for performing the step 44A shown in FIG. 9 according to the present invention. Referring to FIG. 10, the demodulator 18A includes an inverter 120 and a second switch 122.

Referring to FIGS. 9 and 10, after step 42, the inverter 120 inverts the amplified result $V_{co}$ received from the amplifier 16 and outputs the inverted result $-V_{co}$ to the second switch 122 in step 100. After step 100, the second switch 122 determines whether the level of the control signal $V_c$ received from the controller 20 is a first or second level in step 102. Here, the second level is complementary to the first level. For example, the first level may be a "low" level.

If the level of the control signal $V_c$ is determined to be the first level, the second switch 122 determines the result inverted in the inverter 120 as the demodulated result $V_o$ and outputs the determined demodulated result $V_o$ to the change measuring unit 22 in step 104. On the other hand, if the level of the control signal $V_c$ is determined to be the second level, the second switch 122 determines the amplified result $V_{co}$ received from the amplifier 16 as the demodulated result $V_o$ and outputs the determined demodulated result $V_o$ to the change measuring unit 22 in step 106. That is, the second switch 122 selectively outputs one of the inverted result $-V_{co}$ received from the inverter 120 and the amplified result $V_{co}$ received from the amplifier 16 as the demodulated result $V_o$ in response to the control signal $V_c$ received from the controller 20. To this end, the controller 20 generates the control signal $V_c$ per unit period of an input signal or inverted input signal input through the input terminal IN4 and outputs the generated control signal $V_c$ to the demodulator 18. Furthermore, unlike that shown in FIG. 1, the controller 20 may generate a control signal $V_c$ per unit period of the first or second modulating signal $v_{m1}$ or $v_{m2}$ output from the first or second gain adjuster 10 or 12.

It will now be described whether the inverter 120 and the second switch of FIG. 10 can receive the amplified result $V_{co}$ from the amplifiers 16A and 16B of FIGS. 7 and 8. If the first and second modulating signals $v_{m1}$ and $v_{m2}$ received from the object 14 are sine waves, the inverter 120 and the second switch 122 of FIG. 10, that is, the demodulator 18A, can receive the amplified result $V_{co}$ from the amplifier 16A of FIG. 7 or 16B of FIG. 8. On the other hand, if the first and second modulating signals $v_{m1}$ and $v_{m2}$ received from the object 14 are square waves, the demodulator 18A cannot receive the amplified result $V_{co}$ from the amplifier 16A of FIG. 7 but receive it from the amplifier 16B of FIG. 8.

Figure 11:
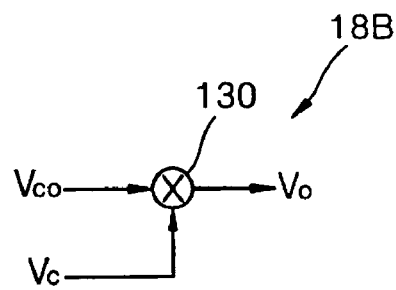
FIG. 11 is a circuit diagram of a second embodiment of the demodulator of FIG. 1 according to the present invention.

FIG. 11 is a circuit diagram of a second embodiment 18B of the demodulator 18 of FIG. 1 according to the present invention. Referring to FIG. 11, the demodulator 18B is comprised of only a second multiplier 130. The second multiplier 130 multiples the control signal $V_c$ received from the controller 20 by the amplified result $V_{co}$ received from the amplifier 16 and outputs the multiplication result to the change measuring unit 22 as the demodulated results $V_o$. It will now be described whether the second multiplier 130 can receive the amplified result $V_{co}$ from the amplifiers 16A and 16B of FIGS. 7 and 8. If the first and second modulating signals $v_{m1}$ and $v_{m2}$ received from the object 14 are sine waves, the second multiplier 130 of FIG. 11, that is, the demodulator 18B, can receive the amplified result $V_{co}$ from the amplifier 16A of FIG. 7 or 16B of FIG. 8. On the other hand, if the first and second modulating signals $v_{m1}$ and $v_{m2}$ received from the object 14 are square waves, the demodulator 18B of FIG. 11 cannot be used as the demodulator 18 of FIG. 1.

Figure 12:
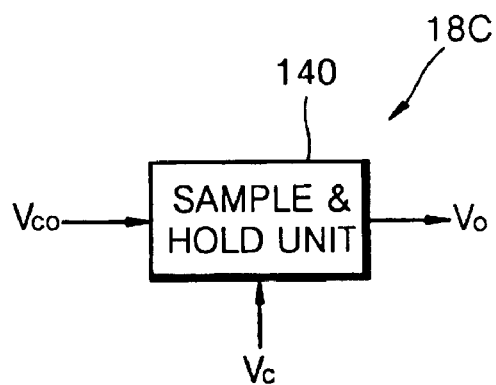
FIG. 12 is a circuit diagram of a third embodiment of the demodulator of FIG. 1 according to the present invention.

FIG. 12 is a circuit diagram of a third embodiment 18C of the demodulator 18 of FIG. 1 according to the present invention. Referring to FIG. 12, the demodulator 18C is comprised of only a sample & hold unit 140. The sample & hold unit 140 samples and holds the amplified result $V_{co}$ received from the amplifier 16 of FIG. 1 in response to the control signal $V_c$ received from the controller 20, and outputs the result of sampling and holding to the change measuring unit 22 as the demodulated result $V_o$.

It will now be described whether the sample & hold unit 140 of FIG. 12 can receive the amplified result $V_{co}$ from the amplifiers 16A and 16B of FIGS. 7 and 8. If the first and second modulating signals $v_{m1}$ and $v_{m2}$ received from the object 14 are sine waves, the sample & hold unit 140 of FIG. 12, that is, the demodulator 18C, cannot be used as the demodulator 18 of FIG. 1. On the other hand, if the first and second modulating signals $v_{m1}$ and $v_{m2}$ received from the object 14 are in the form of square waves, the demodulator 18C of FIG. 12 cannot receive the amplified result $V_{co}$ from the amplifier 16B of FIG. 8 but receive it from the amplifier 16A of FIG. 7.

Turning to FIG. 2, after step 44, the change measuring unit 22 measures a change $\Delta c$ in capacitance within the object 14 from the demodulated result $V_o$ received from the demodulator 18 and outputs the measured change $\Delta c$ in capacitance in step 46. For this purpose, the change measuring unit 22 may be implemented as a low-pass filter (not shown) to low-pass filter the demodulated result $V_o$ received from the demodulator 18 and thereby determine the low-pass filtered result as the change $\Delta c$ in capacitance. Furthermore, if the demodulator 18 is implemented as the sample & hold unit 140 of FIG. 12, the low-pass filter implementing the change measuring unit 22 serves to smooth the demodulated result $V_o$.

For ease of understanding, the above apparatus and method for measuring a change in capacitance according to the present invention will now be described considering the shapes of the first and second modulating signals $v_{m1}$ and $v_{m2}$ and the implementation forms of the amplifier 16 and the demodulator 18.

Figure 13:
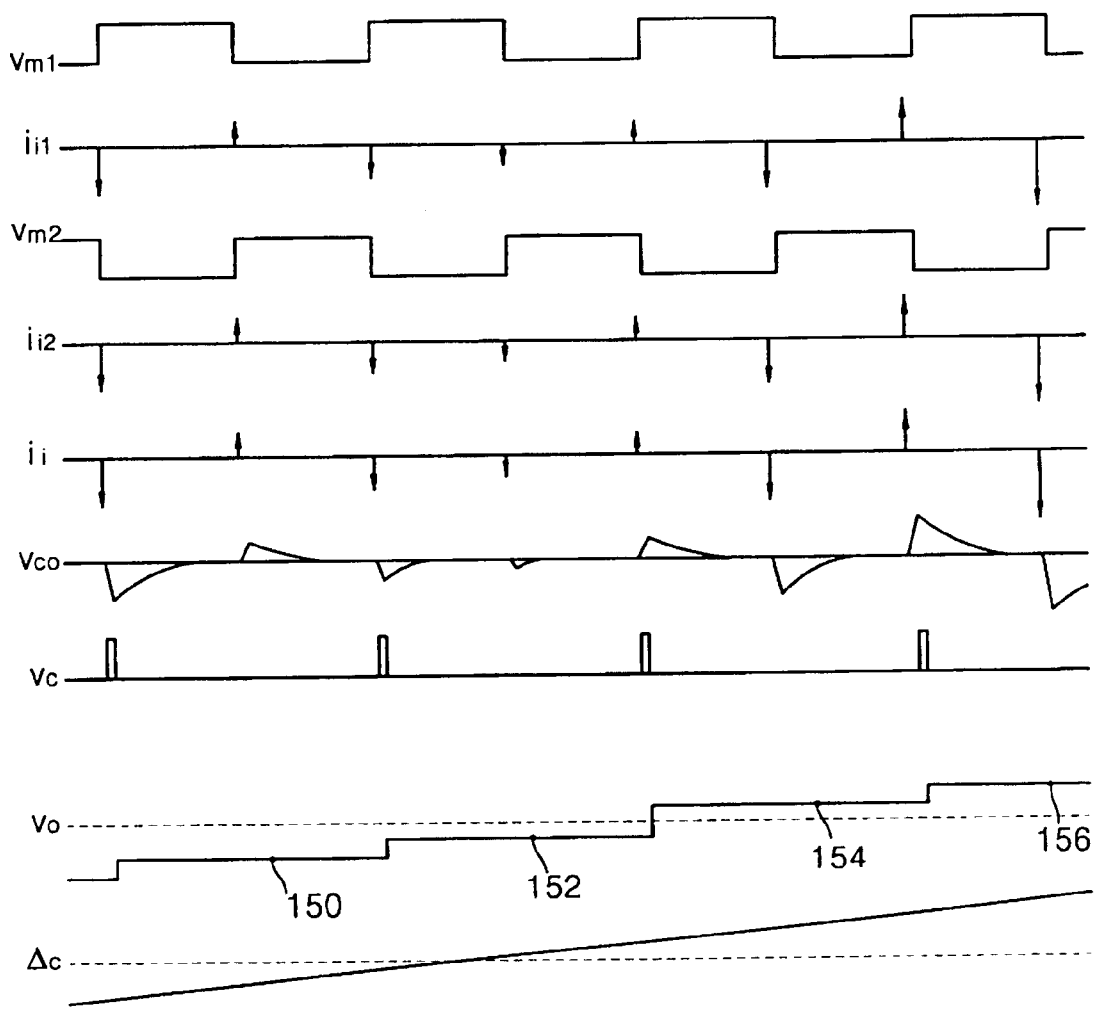
FIG. 13 shows waveforms of signals output from the components of FIG. 1 when first and second modulating signals are square waves.

First, it is assumed that the first and second modulating signals $v_{m1}$ and $v_{m2}$ are square waves and that the amplifier 16 and the demodulator 18 are implemented as the amplifier 16A of FIG. 7 and the sample & hold unit 140 of FIG. 12, respectively. FIG. 13 shows the waveforms of signals output from the components of FIG. 1 on the assumption that the first and second modulating signals $v_{m1}$ and $v_{m2}$ are square waves.

Referring to FIG. 13, the object 14 of FIG. 1 superimposes current $i_{i1}$ generated by the first modulating signal $v_{m1}$ received from the first gain adjuster 10 and current $i_{i2}$ generated by the second modulating signal $v_{m2}$ received from the second gain adjuster 12 and outputs the superimposed result to the amplifier 16A as a modulated signal $i_i$. The amplifier 16A of FIG. 7 amplifies the modulated signal $i_i$ in the form of voltage and outputs the amplified result $V_{co}$ to the sample & hold unit 140 of the demodulator 18C of FIG. 12. The sample & hold unit 140 demodulates the amplified result $V_{co}$, received from the amplifier 16A, in response to a control signal $V_c$ received from the controller 20, and outputs the demodulated result $V_o$ to the change measuring unit 22. Here, the controller 20 generates the control signal $V_c$ using the first or second modulating signal $v_{m1}$ or $v_{m2}$ received from the first or second gain adjuster 10 or 12. For example, the controller 20 may output to the demodulator 18C a one shot pulse generated on the rising edge of the first modulating signal $v_{m1}$ received from the first gain adjuster 10, or a one shot pulse generated on the failing edge of the second modulating signal $v_{m2}$ received from the second gain adjuster 12 as the control signal $V_c$. The change measuring unit 22 is implemented as a low-pass filter (not shown) to low-pass filter the demodulated result $V_o$ received from the demodulator 18C, thereby linearly connecting half-period points 150,152, 154, and 156 of an input signal (or the first modulating signal $v_{m1}$) and outputting the linearly connected result as a change $\Delta c$ in capacitance.

Figure 14:
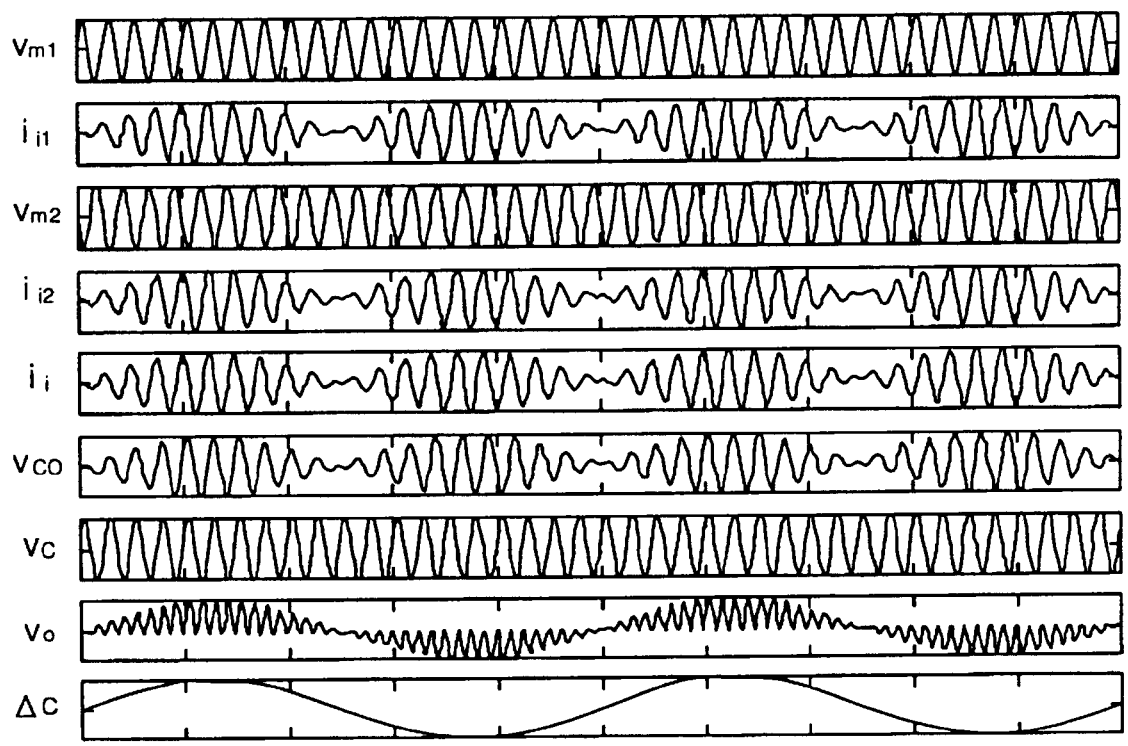
FIG. 14 shows waveforms of signals output from the components of FIG. 1 when the first and second modulating signals are sine waves.

Next, it is assumed that the first and second modulating signals $v_{m1}$ and $v_{m2}$ are sine waves and that the amplifier 16 and the demodulator 18 are implemented as the amplifier 16A of FIG. 7 and the second multiplier 130 of FIG. 11, respectively. FIG. 14 shows the waveforms of signals output from the components of FIG. 1 assuming that the first and second modulating signals $v_{m1}$ and $v_{m2}$ are sine waves. Referring to FIG. 14, the object 14 of FIG. 1 superimposes current $i_{i1}$ generated by the first modulating signal $v_{m1}$ received from the first gain adjuster 10 and current $i_{i2}$ generated by the second modulating signal $v_{m2}$ received from the second gain adjuster 12 and outputs the superimposed result to the amplifier 16A as a modulated signal $i_i$. The amplifier 16A of FIG. 7 amplifies the modulated signal $i_i$ in the form of voltage and outputs the amplified result $V_{co}$ to the demodulator 18B of FIG. 11. The second multiplier 130 of the demodulator 18B multiplies a control signal $V_c$ received from the controller 20 by the amplified result $V_{co}$ received from the amplifier 16A and outputs the multiplication result to the change measuring unit 22 as the demodulated result $V_o$. The change measuring unit 22 is implemented as a low-pass filter (not shown) to detect an envelope of the demodulated result $V_o$ received from the demodulator 18B and output the detected envelope as a change $\Delta c$ in capacitance.

Figure 15:
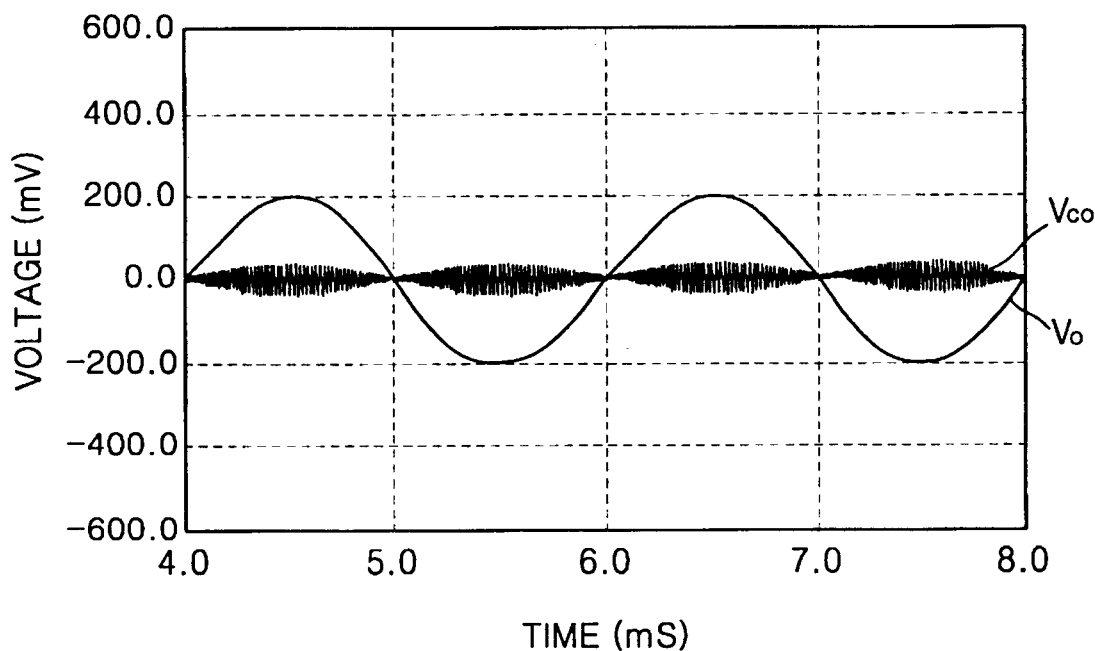
FIG. 15 shows waveforms of the amplified result and the demodulated result when parasitic capacitance does not exist in an object in which a change in capacitance is to be measured.
Figure 16:
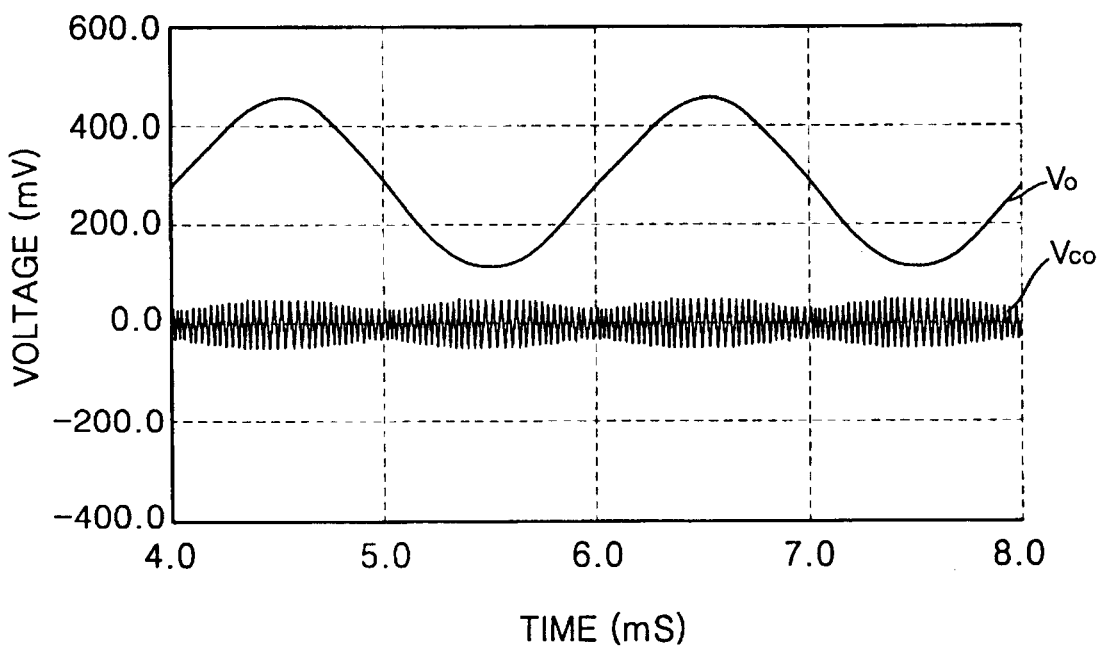
FIG. 16 shows waveforms of the amplified result and the demodulated result when an offset is produced by parasitic capacitance.
Figure 17:
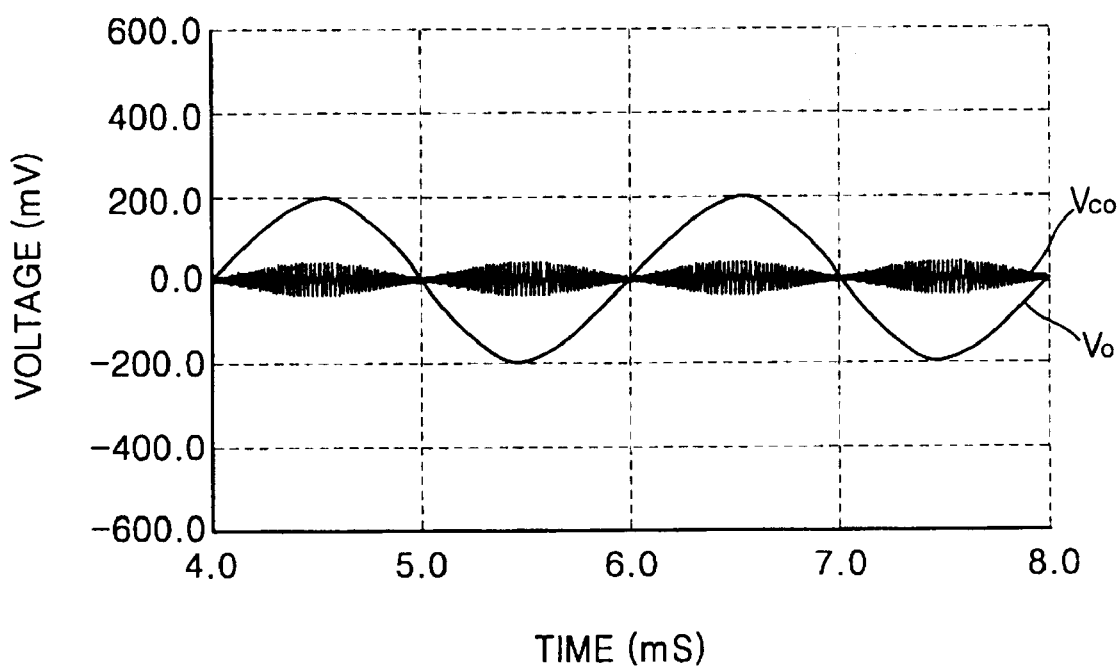
FIG. 17 shows waveforms of the amplified result and the demodulated result when an offset produced by parasitic capacitance is compensated for by the present invention.

FIG. 15 shows voltage-time waveforms of the amplified result $V_{co}$ and the demodulated result $V_o$ under the ideal condition in which parasitic capacitance does not exist in the object 14. FIG. 16 shows voltage-time waveforms of the amplified result $V_{co}$ and the demodulated result $V_o$ when an offset is produced by parasitic capacitance $C_{p1}$ and $C_{p2}$ in the object 14. FIG. 17 shows voltage-time waveforms of the amplified result $V_{co}$ and the demodulated result $V_o$ when the present invention compensates for an offset produced by the parasitic capacitance $C_{p1}$ and $C_{p2}$ in the object 14.

If parasitic capacitance does not exist in the object 14, as shown in FIG. 15, an offset between the amplified result $V_{co}$ and the demodulated result $V_o$ is not produced. However, since the object 14 actually has the parasitic capacitance $C_{p1}$ and $C_{p2}$, as shown in FIG. 16, an offset of about 300 mV is produced between the amplified result $V_{co}$ and the demodulated result $V_o$.

On the other hand, as shown in FIG. 17, the apparatus and method for measuring a change in capacitance according to the present invention described above compensate for the offset, which exists between the amplified result $V_{co}$ and the demodulated result $V_o$ as shown in FIG. 16, thereby outputting the same amplified result $V_{co}$ and demodulated result $V_o$ as would be obtained under the ideal conditions.

As described above, an apparatus and method for measuring a change in capacitance according to the present invention are able to independently adjust the gains of the first and second modulating signals $v_{m1}$ and $v_{m2}$, thereby compensating for an offset produced by parasitic capacitance without affecting the change in capacitance to be measured. Furthermore, the gain of the change in capacitance to be measured is not affected by parasitic capacitances but maintained constantly, thereby allowing for a precise measurement of the change in capacitance.

What is claimed is:

1. An apparatus for measuring a change in capacitance in an object modeled as first and second capacitors connected in series between first and second terminals, wherein the capacitance of one of the first and second capacitors increases by a certain amount and that of the other decreases by the same amount when a perturbation is applied, the apparatus comprising:

a first gain adjuster that adjusts the gain of an input signal and outputs the gain-adjusted input signal to the first terminal as a first modulating signal;

a second gain adjuster that adjusts the gain of an inverted input signal and outputs the gain-adjusted inverted input signal to the second terminal as a second modulating signal;

an amplifier that amplifies a modulated signal output from a junction between the first and second capacitors and outputs the amplified result;

a demodulator that demodulates the amplified result received from the amplifier in response to a control signal and outputs the demodulated result;

a controller that generates the control signal per unit period of the input signal and outputs the generated control signal to the demodulator; and a change measuring unit that measures the change in capacitance from the demodulated result received from the demodulator.

2. The apparatus of claim 1, wherein the first gain adjuster adjusts the gain of the input signal to generate the first modulating signal $v_{m1}$ expressed by the following equation:

$$v_{m1}=\alpha(V_m/2+v_m)$$

where $V_m/2+v_m$ denotes the input signal, $v_m$ denotes $V_m/2$, $\alpha$ equals $2(C_o+C_{p2})/(2C_o+C_{p1}+C_{p2})$, $C_o$ denotes nominal capacitance of the object, $C_{p1}$ denotes parasitic capacitance induced between the first terminal and the junction, and $C_{p2}$ denotes parasitic capacitance induced between the junction and the second terminal, and wherein the second gain adjuster adjusts the gain of the inverted input signal to generate the second modulating signal $v_{m2}$ expressed by the following equation:

$$v_{m2}=\beta(V_m/2-v_m)$$

where $V_m/2- v_m$ denotes the inverted input signal and $\beta$ equals $$(C_o+C_{p1})/(2C_o+C_{p1}+C_{p2}).$$

3. The apparatus of claim 2, wherein $\alpha+\beta$ equals 2.

4. The apparatus of claim 1, wherein the object is an electrostatic accelerometer, and the change in capacitance is used to measure the acceleration of the electrostatic accelerometer.

5. The apparatus of claim 1, wherein the object is an actuator, and the change in capacitance is used to measure the position of the actuator.

6. The apparatus of claim 1, wherein the object is a gyroscope, and the change in capacitance is used to measure the angular velocity of the gyroscope.

7. The apparatus of claim 1, wherein the first gain adjuster comprises a first variable resistor connected between the input signal and a reference potential, and the first modulating signal is a voltage drop across the first variable resistor.

8. The apparatus of claim 1, wherein the first gain adjuster comprises a first multiplier that multiplies a direct current voltage by the input signal and outputs the multiplication result as the first modulating signal.

9. The apparatus of claim 1, wherein the first gain adjuster comprises:

a first resistor having one end coupled to the input signal;

a second variable resistor coupled between the other end of the first resistor and the first modulating signal; and a first operational amplifier having a negative input terminal connected to the other end of the first resistor, a positive input terminal connected to a reference potential, and an output terminal connected to the first modulating signal.

10. The apparatus of claim 1, wherein the first gain adjuster comprises:

a digital-to-analog converter that receives a digital signal having a predetermined amplitude as the input signal, converts the digital signal into a first analog signal, and outputs the first analog signal; and a first switch that is periodically switched with a first predetermined period to alternately output one of the first analog signal received from the digital-to-analog converter and a reference signal as the first modulating signal, wherein the first modulating signal is a square wave.

11. The apparatus of claim 1, wherein the second gain adjuster comprises a first variable resistor connected between the inverted input signal and a reference potential, and the second modulating signal is a voltage drop across the first variable resistor.

12. The apparatus of claim 1, wherein the second gain adjuster comprises a first multiplier that multiplies a direct current voltage by the inverted input signal and outputs the multiplication result as the second modulating signal.

13. The apparatus of claim 1, wherein the second gain adjuster comprises:

a first resistor having one end connected to the inverted input signal;

a second variable resistor connected between the other end of the first resistor and the second modulating signal; and a first operational amplifier having a negative input terminal connected to the other end of the first resistor, a positive input terminal connected to a reference potential, and an output terminal connected to the second modulating signal.

14. The apparatus of claim 1, wherein the second gain adjuster comprises:

a digital-to-analog converter that receives a digital signal having a predetermined amplitude as the inverted input signal, converts the digital signal into a second analog signal, and outputs the second analog signal; and a first switch that is periodically switched with a second predetermined period to alternately output one of the second analog signal received from the digital-to-analog converter and a reference signal as the second modulating signal, wherein the second modulating signal is a square wave.

15. The apparatus of claim 1, wherein the amplifier comprises:

a second resistor coupled between the modulated signal and the amplified result;

a third capacitor coupled to the second resistor in parallel; and a second operational amplifier having a negative input terminal connected to the modulated signal, a positive input terminal connected to a reference potential, and an output terminal connected to the amplified result.

16. The apparatus of claim 1, wherein the amplifier comprises a third operational amplifier having a positive input terminal coupled to the modulated signal, a negative input terminal coupled to the amplified result, and an output terminal.

17. The apparatus of claim 15, wherein the demodulator comprises a sample & hold unit that samples and holds the amplified result received from the amplifier in response to the control signal and outputs the result of sampling and holding as the demodulated result, and wherein the input signal is a square wave.

18. The apparatus of claim 15, wherein the demodulator comprises a second multiplier that multiplies the control signal by the amplified result received from the amplifier and outputs the multiplication result as the demodulated result, and wherein the input signal is a sine wave.

19. The apparatus of claim 15, wherein the demodulator comprises:

an inverter that inverts the amplified result received from the amplifier and outputs the inverted result; and a second switch that selectively outputs one of the inverted result received from the inverter and the amplified result received from the amplifier as the demodulated result in response to the control signal, and wherein the input signal is a sine wave.

20. The apparatus of claim 16, wherein the demodulator comprises:

an inverter that inverts the amplified result received from the amplifier and outputs the inverted result; and a second switch that selectively outputs one of the inverted result received from the inverter and the amplified result received from the amplifier as the demodulated result in response to the control signal.

21. The apparatus of claim 16, wherein the demodulator comprises a second multiplier that multiplies the control signal by the amplified result received from the amplifier and outputs the multiplication result as the demodulated result, and wherein the input signal is a sine wave.

22. The apparatus of claim 1, wherein the change measuring unit comprises a low-pass filter that low-pass filters the demodulated result received from the demodulator and outputs the low-pass filtered result as the change in capacitance.

23. The apparatus of claim 1, wherein the input signal is a periodic square wave.

24. The apparatus of claim 1, wherein the input signal is a periodic sine wave.

25. A method for measuring a change in capacitance performed by the apparatus as claimed in claim 1, the method comprising the steps of:

(a) adjusting the gain of the input signal to obtain the first modulating signal and adjusting the gain of the inverted input signal to obtain the second modulating signal;

(b) amplifying the modulated signal measured at a junction between the first and second capacitors;

(c) demodulating the amplified result using the control signal; and (d) measuring the change in capacitance using the demodulated result.

26. The method of claim 25, wherein the step (a) comprises the steps of:

converting a digital signal having a predetermined amplitude corresponding to the input signal into a first analog signal and converting a digital signal having the amplitude corresponding to the inverted input signal into a second analog signal; and alternately determining one of the first analog signal and a reference signal as the first modulating signal and alternately determining one of the second analog signal and the reference signal as the second modulating signal, wherein the first and second modulating signals are complementarily determined each other and are square waves.

27. The method of claim 25, wherein the step (c) comprises the steps of:

(c1) inverting the result amplified in the step (b);

(c2) determining whether the level of the control signal is a first level or a second level complementary to the first level;

(c3) determining the result inverted in the step (c1) as the demodulated result if the level of the control signal is determined to be the first level; and (c4) determining the result amplified in the step (b) as the demodulated result if the level of the control signal is determined to be the second level.

28. The method of claim 25, wherein the step (d) comprises the step of low-pass filtering the demodulated result and determining the low-pass filtered result as the change in capacitance.

29. The method of claim 25, wherein the step of adjusting the gain of the input signal to obtain the first modulating signal and adjusting the gain of the inverted input signal to obtain the second modulating signal comprises the step of:

adjusting the input signal as a function of a nominal capacitance and parasitic capacitances associated with the first and second capacitors, and adjusting the inverted input signal as a function of the nominal capacitance and the parasitic capacitances.

30. The apparatus of claim 1, wherein the first gain adjuster comprises means for adjusting the input signal as a function of a nominal capacitance and parasitic capacitances associated with the first and second capacitors, and wherein the second gain adjuster comprises means for adjusting the inverted input signal as a function of the nominal capacitance and the parasitic capacitances.

* * * * *